US010802093B2

(12) United States Patent
Demharter

(10) Patent No.: US 10,802,093 B2
(45) Date of Patent: Oct. 13, 2020

(54) ACQUISITION OF MAGNETIC RESONANCE SIGNALS

(71) Applicant: Siemens Healthcare GmbH, Erlangen (DE)

(72) Inventor: Nikolaus Demharter, Dormitz (DE)

(73) Assignee: Siemens Healthcare GmbH, Erlangen (DE)

( * ) Notice: Subject to any disclaimer, the term of this patent is extended or adjusted under 35 U.S.C. 154(b) by 14 days.

(21) Appl. No.: 16/226,004

(22) Filed: Dec. 19, 2018

(65) Prior Publication Data

US 2019/0195971 A1 Jun. 27, 2019

(30) Foreign Application Priority Data

Dec. 21, 2017 (EP) .................... 17209660

(51) Int. Cl.
*G01R 33/36* (2006.01)
*G01R 33/34* (2006.01)
*G01R 33/56* (2006.01)

(52) U.S. Cl.
CPC ......... *G01R 33/3664* (2013.01); *G01R 33/34* (2013.01); *G01R 33/56* (2013.01)

(58) Field of Classification Search
CPC ..... G01R 33/3664; G01R 33/34; G01R 33/56
See application file for complete search history.

(56) References Cited

U.S. PATENT DOCUMENTS

| 8,901,929 | B2 | 12/2014 | Biber et al. |
| 2009/0174498 | A1 | 7/2009 | Xing |
| 2010/0271022 | A1 | 10/2010 | Mitsui et al. |
| 2013/0338488 | A1 | 12/2013 | Dietz |
| 2014/0159721 | A1 | 6/2014 | Grodzki |
| 2014/0347054 | A1 | 11/2014 | Kimmlingen |
| 2015/0054506 | A1 | 2/2015 | Eberler |

FOREIGN PATENT DOCUMENTS

| DE | 102012210280 B4 | 8/2015 |
| WO | WO2009139287 A1 | 11/2009 |

OTHER PUBLICATIONS

Jouda et al., Circuit Level Simulation of MRI Receive Chain Using Excitation Derived from Images, Concepts in Magnetic Resonance Part B, vol. 44B(4) p. 102-113. (Year: 2015).*
European Office Action for European Patent Application No. 17209660.4-1022, dated Jun. 26, 2018.

* cited by examiner

*Primary Examiner* — Susan S Lee
(74) *Attorney, Agent, or Firm* — Lempia Summerfield Katz LLC

(57) ABSTRACT

Systems and methods are provided for receiving magnetic resonance signals by a magnetic resonance device. The magnetic resonance signals are received using at least one active receive coil element. The magnetic resonance device includes a multiplexer with a signal output and a number of signal inputs. A first portion of the signal inputs are each connected with one of the at least one active receive coil element. The remaining portion of the number of signal inputs are not connected to an active receive coil element. The multiplexer does not interconnect at least one part of the remaining part of the number of signal inputs with the signal output.

20 Claims, 5 Drawing Sheets

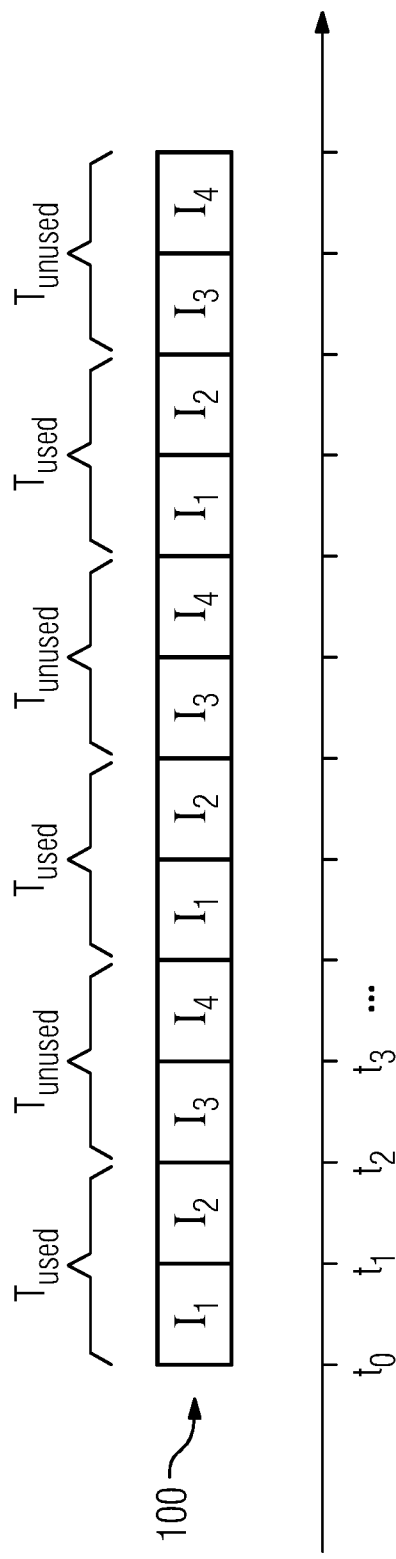
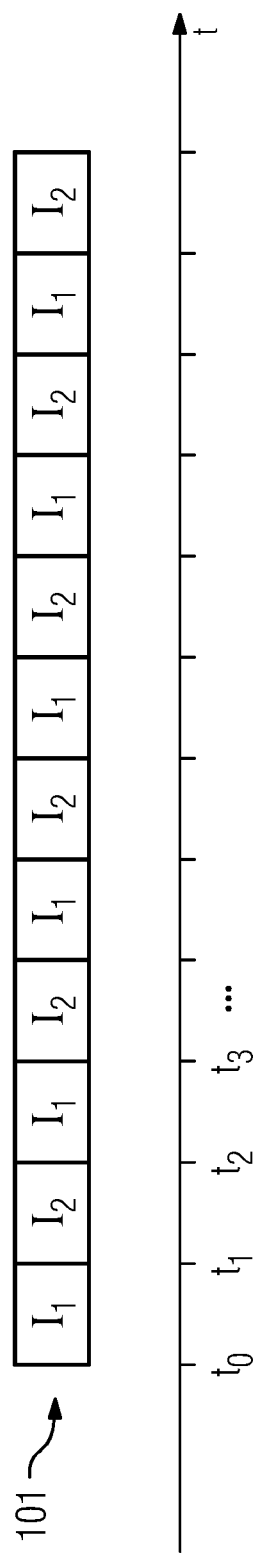

ACQUISITION OF MAGNETIC RESONANCE SIGNALS

CROSS REFERENCE TO RELATED APPLICATIONS

This application claims the benefit of EP17209660.4 filed on Dec. 21, 2017, which is hereby incorporated by reference in its entirety.

FIELD

Embodiments relate to a method for receiving magnetic resonance signals using a magnetic resonance device.

BACKGROUND

Magnetic resonance tomography (MRT) or magnetic resonance imaging (MRI) is an examination technology for generating images of an inside of a patient's body that is based upon the physical phenomenon of magnetic resonance (MR). A magnetic resonance device includes a transmission system, with which radio frequency (RF) electromagnetic excitation pulses, often also referred to as RF pulses, are generated and are irradiated into the patient during a magnetic resonance measurement. The publications US 20140347054 A1, U.S. Pat. No. 8,901,929 B2 and DE 10 2012 210 280 B4 show various embodiments of a transmission system, by way of example. A magnetic alternating field with a transmit frequency, which is also referred to as B1 field, results from the RF irradiation. The irradiated excitation pulses are able to deflect nuclear spins in order to obtain a desired flip angle distribution for the respective examination. The deflected nuclear spins in turn emit magnetic resonance signals that are measured by one or more receive coil elements.

A receive coil element may refer to an antenna and/or an electrically conductive loop that is configured to receive magnetic resonance signals. A magnetic resonance coil may include one or more receive coil elements. Magnetic resonance coils may be fixedly installed in the magnetic resonance device, like, e.g. whole body coils or arranged locally on the patient, like, e.g. local coils or surface coils. A whole body coil and a local coil are described by way of example in US 20150054506 A1 and US 20140159721 A1 in each instance.

The images of the inside of the patient's body may be generated by reconstructing the magnetic resonance signals. In order to obtain meaningful images, it is important to use high quality data for reconstruction purposes. It is also desirable to reduce the measurement time involved in acquiring the magnetic resonance signals.

SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide improved data for the reconstruction and/or to reduce the time involved in acquiring the data.

Embodiments provide a method for receiving magnetic resonance signals using a magnetic resonance device. The magnetic resonance device includes at least one active receive coil element, with which magnetic resonance signals are received, and a multiplexer with a signal output and a number of signal inputs. Part of the number of signal inputs is connected to in each case one active receive coil element and the remaining part of the number of signal inputs is not connected to an active receive coil element. A connection between an active receive coil element and a signal input includes any type of coupling, such as, for example an electrical and/or optical coupling, that allows signals to be transmitted between the active receive coil element and the signal input. The multiplexer does not interconnect at least one part of the remaining part of the number of signal inputs, which is not connected to an active receive coil element, with the signal output.

As a result of the multiplexer not interconnecting at least one part of the remaining part of the number of signal inputs that is not connected to an active receive coil element, with the signal output, more useful magnetic resonance signals may be received by the magnetic resonance device so that the database for the reconstruction of MR images is improved. Furthermore, the magnetic resonance signals may be acquired more quickly since unused measurement time may be better avoided. By contrast, conventional multiplexers are operated such that all signal inputs are interconnected, in other words also all signal inputs that are not connected to an active receive coil element. In the time frames in which signal inputs are interconnected with the signal output and are not connected to an active receive coil element, no usable magnetic resonance signals may be processed.

A multiplexer may be regarded as a switching matrix and/or selection circuit with a number of inputs and typically one output. Using a number of multiplexers, a number of receive coil elements may typically be connected to the magnetic resonance device, that corresponds to the sum of the inputs of the multiplexer or multiplexers.

The multiplexer may be activated by a system control unit of the magnetic resonance device. As a result, the mode of operation, for example, the switching processes, of the multiplexer may be monitored.

The magnetic resonance device may not only include one multiplexer, but instead multiple multiplexers, that in each case likewise do not interconnect at least one part of the remaining part of the number of signal inputs, that is not connected to an active receive coil element, with the signal output. Embodiments may therefore also be transferred readily to a plurality of multiplexers.

An active receive coil element may refer to an antenna element that receives high-frequency magnetic resonance signals. For example, an active receive coil element is a receive coil element that is provided for the respective examination for receiving the magnetic resonance signals. An active receive coil element is a receive coil element with which magnetic resonance signals are intentionally received. An active antenna element therefore differs from possible antenna elements that may also be connected to any signal inputs of the multiplexer, but are however not to be used at all for a respective examination. The multiplexer is activated so that the possible signal inputs, that are connected to receive coil elements not provided for receiving purposes, are not interconnected with the signal output. Information required for such an activation may be stored in a system control unit of the magnetic resonance device.

The magnetic resonance device identifies whether an active receive coil element is connected to a signal input of the multiplexer, e.g. whether a local coil is connected to one or more active receive coil elements. The information as to whether an active receive coil element is connected to a signal input of the multiplexer is transmitted to the system control unit and/or the useful signal inputs are automatically interconnected with the signal output.

Signals, for example, electrical and/or optical signals, may be transmitted from a signal input that is interconnected with the signal output, from the signal input to the signal output of the multiplexer. The signals are magnetic resonance signals, that have been received previously, as described above, by the active receive coil element.

After receipt the magnetic resonance signal may be modified by the active receive coil element and prior to coupling by way of the signal input into the multiplexer. For example, the magnetic resonance signals are mixed with a carrier signal and an intermediate frequency signal may be generated.

In an embodiment, only one signal input is ever interconnected with the signal output at one point, e.g. two or more signal outputs are not interconnected with the signal output at the same time.

An embodiment provides that the multiplexer permanently interconnects one of the signal inputs, that are connected to an active receive coil element in each case, with the signal output. Permanently implies that the interconnection may naturally be interrupted by possible short switching processes.

As a result of the multiplexer permanently interconnecting one of the signal inputs, that are connected in each case to an active receive coil element, with the signal output, useful magnetic resonance signals may be received continuously by the magnetic resonance device so that the database improves for the reconstruction of the MR images. The examination time of the patient may therefore be used optimally.

It is not always the same signal input that is interconnected, e.g. the one interconnected signal input may be switched between the signal inputs that are connected to the active receive coil elements.

The magnetic resonance device includes a number of active receive coil elements, with which magnetic resonance signals are received. The number of active receive coil elements may amount to one or more. Each of the active receive coil elements may be connected to one of the signal inputs in each case. For example, the multiplexer may include a number of signal inputs that is greater than the number of active receive coil elements, e.g. the number of signal inputs amounts to at least two.

The multiplexer may repeatedly interconnect the signal inputs, that are connected to an active receive coil element in each case. As a result, magnetic resonance signals may be repeatedly transmitted by way of the multiplexer by an active receive coil element providing an improved evaluation of the magnetic resonance signals.

The number of active receive coil elements may amounts to at least two. The multiplexer consecutively interconnects the signal inputs, that are connected to in each case one of the at least two active receive coil elements, with the signal output.

For example, a first active receive coil element and a second active receive coil element are connected to a first signal input and to a second signal input in each instance, etc. The first and the second signal input may be interconnected successively with the signal output, e.g. the first signal input is firstly interconnected and then the second signal input is interconnected. The magnetic resonance signals that are received by the first and second receive coil element may therefore be transmitted in a time multiplex method to the signal output of the multiplexer. A successive interconnection of the signal inputs provides for a simple mode of operation of the multiplexer.

The multiplexer preferably interconnects the signal inputs, that are connected to an active receive coil element in each case, with the signal output in an identical sequence. For example, a first signal input and then a second signal input are first interconnected in a first run. In a subsequent second run the first signal input is in turn first interconnected and then the second signal input. The sequence in the first run is therefore the same as in the second run. This provides a simple mode of operation of the multiplexer.

The multiplexer may interconnects the signal inputs, that are connected to an active receive coil element in each case, with the signal output over time periods of equal length. The time segments or time slots are of equal length, in which signals are transmitted from the respective signal inputs to the signal output providing a simple mode of operation of the multiplexer.

The signal output may be connected to an analog-digital converter (ADC). Analog signals that are transmitted by the multiplexer may be converted into digital signals. For example, intermediate frequency signals may be sampled with the analog-digital converter.

The number of active receive coil elements may amounts at most to two, four, or eight. All active receive coil elements may be included in a whole body coil of the magnetic resonance device. The whole body coil may include a comparably small number of receive coil elements.

The number of signal inputs of the multiplexer amounts to at least four, at least eight, or at least sixteen.

The ratio of the number of signal inputs of the multiplexer to the number of active receive coil elements may amount to at least two, at least three, or at least four. The higher the ratio, the larger the usable database for an image reconstruction compared with a conventional mode of operation of the multiplexer.

The magnetic resonance signals received by the active receive coil elements may be evaluated by an evaluation unit of the magnetic resonance device. Magnetic resonance signals are transmitted from the signal output of the multiplexer to the evaluation unit. The magnetic resonance signals may be evaluated after digitalization by an analog-digital converter.

The received magnetic resonance signals may be averaged by the evaluation unit (e.g., at least one average value is formed with the aid of the received magnetic resonance signals). Only the magnetic resonance signals that have been received by in each case the same active receive coil element may be averaged with one another. A signal-to-noise ratio (SNR) of the reconstructed MR images may be improved.

In an embodiment, a magnetic resonance device for receiving magnetic resonance signals is provided. The magnetic resonance device includes at least one active receive coil element, that is configured to receive magnetic resonance signals. The magnetic resonance device includes a multiplexer with one signal output and a number of signal inputs. One part of the number of signal inputs is connected to in each case one active receive coil element and the remaining part of the number of signal inputs is not connected to an active receive coil element. The multiplexer is configured not to interconnect at least one part of the remaining part of the number of signal inputs, that is not connected to an active receive coil element, with the signal output.

The advantages of the magnetic resonance device for receiving magnetic resonance signals correspond to the advantages of the method for receiving magnetic resonance signals, which are described in detail above.

In an embodiment, a computer program product is provided that includes a program and is directly loadable into a memory store of a programmable computing unit of a magnetic resonance device, and includes programming code, for example, libraries and auxiliary functions, in order to carry out a method described previously for receiving magnetic resonance signals, when the computer program product is executed in the computing unit. The computer program product may include an item of software with a source code that may still be compiled and linked or that may only be interpreted, or an executable software code that, for execution, may only be loaded into the system control unit. Using the computer program product, the method for receiving magnetic resonance signals may be performed rapidly, exactly reproducibly and robustly. The computer program product is configured such that it may carry out the acts by the computing unit. The computing unit may have the respective pre-conditions such as, for example, a suitable working memory store, a suitable graphics card, or a suitable logic unit, so that the respective method acts may be carried out efficiently.

The computer program product is stored, for example, on a computer-readable medium or is deposited on a network or server from where it may be loaded into the processor of a local computing unit. In addition, control data of the computer program product may be stored on an electronically readable data carrier. The control information of the electronically readable data carrier may be configured such that it carries out a method when the data carrier is used in a computing unit. Examples of electronic readable data carriers are a DVD, a magnetic tape or a USB stick, on which is stored electronically readable control information, for example software. If this control information is read from the data carrier and stored in a computing unit, all the embodiments of the above-described methods may be carried out. Embodiments may therefore also proceed from the aforementioned computer-readable medium and/or the aforementioned electronically readable data carrier.

BRIEF DESCRIPTION OF THE FIGURES

FIG. 5 depicts an example switching process in time for 2 active receive coil elements and 4 signal inputs.
FIG. 6 depicts an example switching process in time for 2 active receive coil elements and 4 signal inputs.

DETAILED DESCRIPTION

Figure 1:
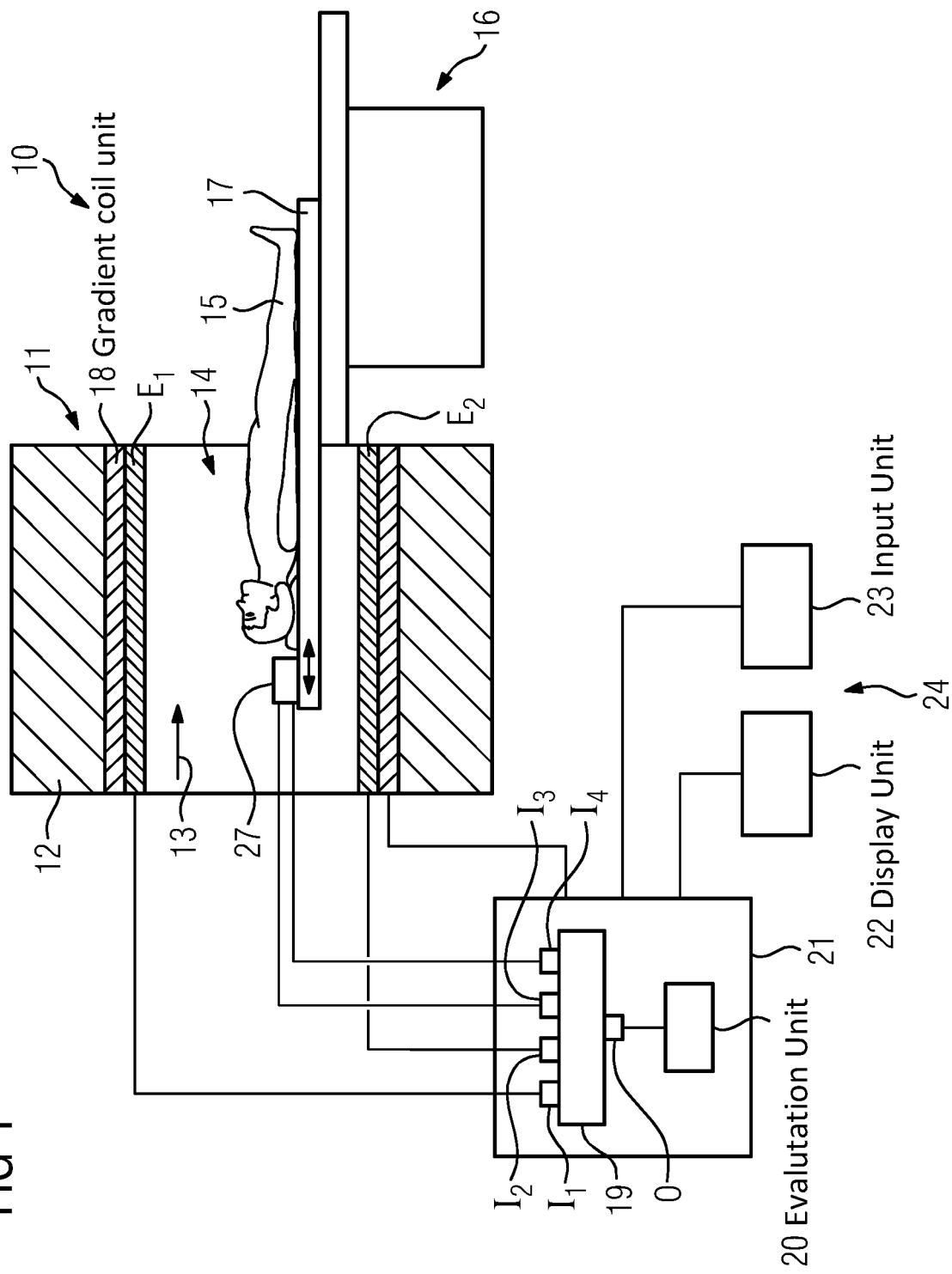
FIG. 1 depicts an example magnetic resonance device.

FIG. 1 depicts a schematic representation of a magnetic resonance device 10. The magnetic resonance device 10 includes a magnet unit 11 that includes a main magnet 12 for generating a strong and for example time constant main magnetic field 13. The magnetic resonance device 10 includes a patient receiving area 14 for receiving a patient 15. In an embodiment the patient receiving area 14 is cylindrical and is surrounded in a peripheral direction by the magnet unit 11 in the manner of a cylinder. The patient receiving area 14 may include a different configuration. The patient 15 may be moved into the patient receiving area 14 by a patient support device 16 of the magnetic resonance device 10. The patient support device 16 includes a patient couch 17 that is configured to be able to move inside the patient receiving area 14.

The magnet unit 11 further includes a gradient coil unit 18 for generating magnetic field gradients that are used for spatial encoding during imaging. The gradient coil unit 18 is controlled by a system control unit 21 of the magnetic resonance device 10. The magnet unit 11 also includes a whole-body coil integrated fixedly in the magnetic resonance device 10 with two receive coil elements $E_1$, $E_2$. The receive coil elements $E_1$, $E_2$ in this example are used also as transmit antennas, for irradiating excitation pulses into an examination space, that is formed by a patient receiving area 14 of the magnetic resonance device 10.

The irradiated excitation pulses are able to deflect nuclear spins in the body of the patient 15. The deflected nuclear spins in turn emit magnetic resonance signals, that are acquired by the receive coil elements $E_1$, $E_2$. The two receive coil elements $E_1$, $E_2$ are active receive coil elements $E_1$, $E_2$.

The magnetic resonance signals received by the active receive coil elements $E_1$, $E_2$ are connected to signal inputs $I_1$, $I_2$ of a multiplexer 19 that is activated by the system control unit 21. The multiplexer 19 additionally includes further signal inputs $I_3$, $I_4$ that are connected to a plug-in position 27 that is arranged on the patient couch 17. There may be the possibility of connecting any local coils with receive coil elements via the plug-in position 27 to the magnetic resonance device, that is not the case here, however. The signal inputs $I_3$, $I_4$ are therefore not connected here to any, for example active, receive coil elements.

The multiplexer 19 includes a signal output O, to which one of the signal inputs $I_1$, $I_2$, $I_3$, $I_4$ may be interconnected. The signal output O is connected to an evaluation unit 20. The evaluation unit 20 is configured to evaluate the magnetic resonance signals that are acquired during the magnetic resonance examination.

In addition, the magnetic resonance device 10 includes a user interface 24 that is connected to the system control unit 21. Control information such as, for example, imaging parameters and reconstructed magnetic resonance images may be displayed on a display unit 22, for example on a monitor, of the user interface 24 for medical operating personnel. In addition, the user interface 24 includes an input unit 23, by which information and/or parameters may be entered during a measurement process by the medical operating personnel.

A method for receiving magnetic resonance signals by a magnetic resonance device is depicted in FIG. 5. The system control unit 21 includes a programmable computing unit, not shown further in FIG. 1, that includes a memory store, in which a computer program product may be loaded for carrying out the method.

Figure 2:
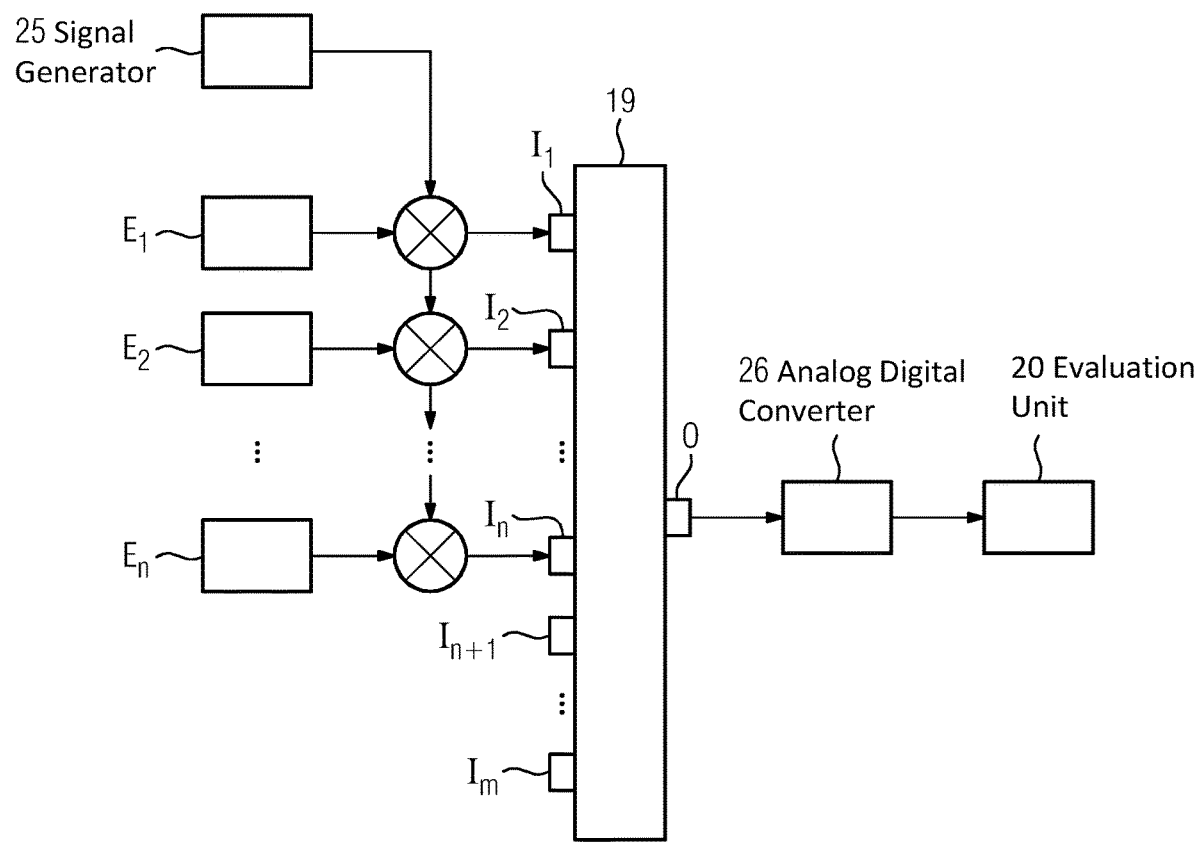
FIG. 2 depicts an example switching arrangement with n active receive coil elements and m signal inputs.

In conjunction with FIG. 2, the method is explained in more detail. At act 50, magnetic resonance signals are received with a number n of active receive coil elements $E_1, \ldots, E_n$ of the magnetic resonance device 10, wherein n≥1.

Moreover, the magnetic resonance device includes a multiplexer 19 with a signal output O and m signal inputs $I_1, \ldots, I_m$, wherein m≥2. Here part of the number of signal inputs $I_1, \ldots, I_n$ is connected in each case to an active receive coil element $E_1, \ldots, E_n$. By contrast, the remaining part $I_m$ of the m signal inputs is not connected to an active receive coil element. The number of signal inputs m is greater than the number of active receive coil elements n.

At act 60, the multiplexer 19 does not interconnect at least one part of the remaining part $I_{1n+1}, \ldots, I_m$ of the number of signal inputs, that is not connected to an active receive coil element, with the signal output O. In this example, the entire remaining part $I_{1n+1}, \ldots, I_m$ of the number of signal inputs, that is not connected to an active receive coil element, is not interconnected with the signal output O.

For example, in act 60, the multiplexer 19 permanently, e.g. only interrupted by a few switching times, interconnects one of the signal inputs $I_1, \ldots, I_n$, that is connected in each case to one active receive coil element $E_1, \ldots, E_n$, with the signal output O.

During a magnetic resonance examination, the acts 50 and 60 may be repeated continuously, e.g. new magnetic resonance signals are always received in act 50, and are transmitted via the multiplexer 19 in act 60 to the signal output O.

The arrangement depicted in FIG. 2 includes an optional signal generator 25, that mixes the magnetic resonance signals received by the active receive coil elements $E_1, \ldots, E_n$ with a carrier signal. An intermediate frequency signal, that is coupled into the signal inputs $I_1, \ldots, I_n$ of the multiplexer 19, results therefrom.

As described above, aside from signal inputs $I_1, \ldots, I_n$ that are connected to the active receive coil elements $E_1, \ldots, E_n$, the multiplexer 19 may include further signal inputs $I_{n+1}, \ldots, I_m$ that are not connected to an active receive coil element. This does not rule out that the further signal inputs $I_{n+1}, \ldots, I_m$ may possibly be connected to one or more non-active receive coil elements, but any signals that are fed into the multiplexer 19 through these further signal inputs $I_{n+1}, \ldots, I_m$ are however not evaluated further. Such non-active receive coil elements may be receive coil elements connected fixedly to the multiplexer 19, for instance, and are only switched on as and when required and are only then active receive coil elements, and are otherwise non-active receive coil elements.

The magnetic resonance signals coupled in via the signal inputs $I_1, \ldots, I_n$ are interconnected with the signal output O. The magnetic resonance signals or intermediate frequency signals may be digitalized by an analog-digital converter 26, e.g. by a sampling with 10 MHz, and then evaluated by an evaluation unit 20. By the use of one or more multiplexers 19, the number of required analog-digital converters 26 in the magnetic resonance device 10 may be reduced by an individual analog-digital converter 26 scanning a number of analog signals in the time multiplex and making the evaluation unit 20 available for the further processing.

Figure 3:
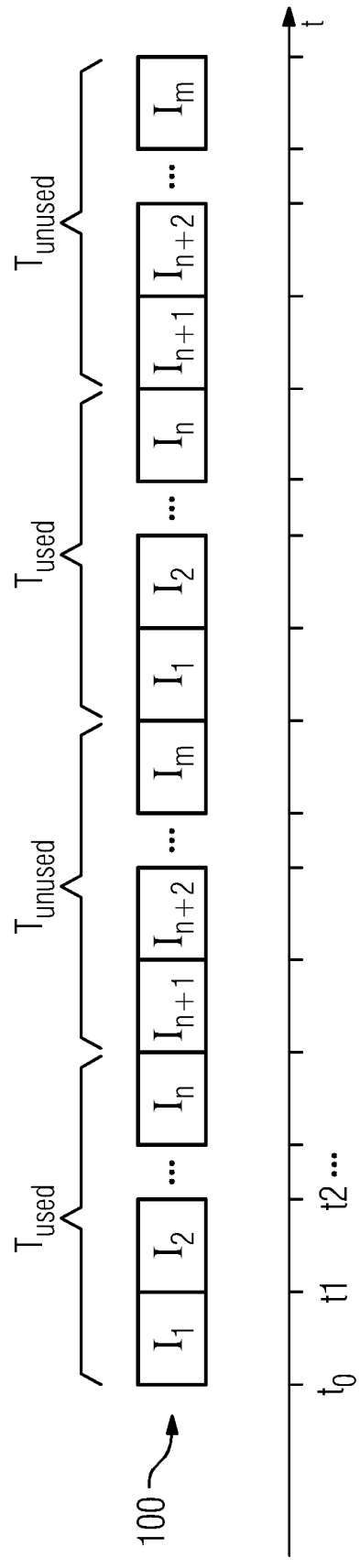
FIG. 3 depicts an example switching process in time for n active receive coil elements and m signal inputs.
Figure 4:
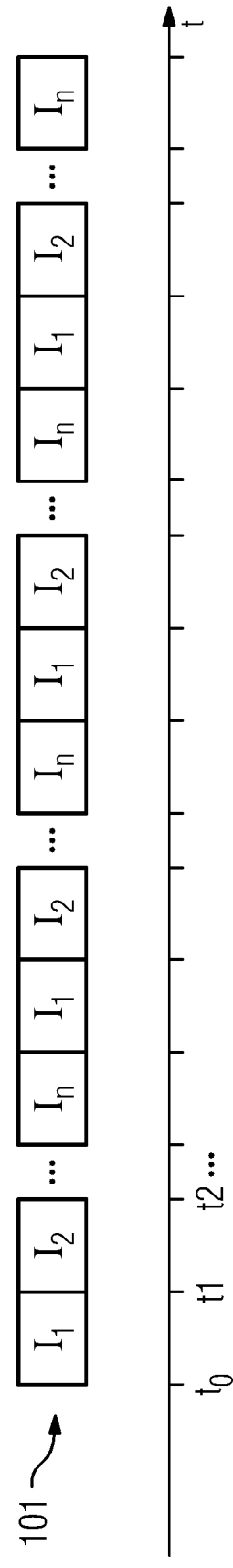
FIG. 4 depicts an example switching process in time for n active receive coil elements and m signal inputs.
Figure 7:
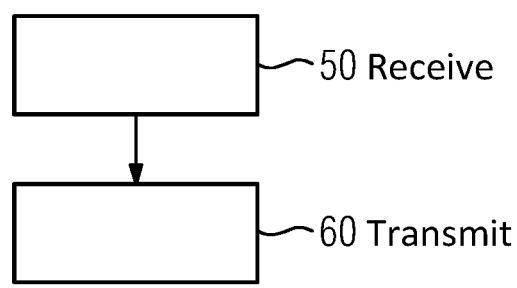
FIG. 7 depicts an example method.

Conversely FIGS. 3 and 4 depict how a conventional mode of operation 100 of the multiplexer 19 according to the prior art, as shown above in FIG. 3, differs from a mode of operation 101, as shown below in FIG. 4. All signal inputs $I_1, \ldots, I_m$ of the multiplexer 19 are interconnected consecutively, e.g. even the signal inputs $I_{n+1}, \ldots, I_m$ that do not supply usable magnetic resonance signals. A time frame between $t_1$ and $t_2$, in which $I_2$ is interconnected, connects to a time frame between $t_0$ and $t_1$, in which $I_1$ is interconnected etc. until a time frame connects, with which the last signal input $I_m$ is also interconnected. A time frame with which $I_1$ is interconnected again and the cycle begins from scratch then connects thereto. On account of the conventional mode of operation 100, only one part of the measurement time $T_{used}$ is used effectively, whereas in a further part of the measurement time $T_{unused}$, no evaluable magnetic resonance signals are recorded, e.g. the unused time slots during $T_{unused}$ result in no signal.

By contrast, in accordance with the mode of operation 101, one of the signal inputs $I_1$ to $I_n$ that are connected to in each case one active receive coil element $E_1$ to $E_n$, interconnects permanently with the signal output O. A time frame, with which $I_{n+1}$ interconnects, therefore does not connect here to a time frame in which $I_n$ is interconnected, instead a new cycle is begun again immediately, in which signal inputs $I_1, \ldots, I_n$ are interconnected, each of which is connected to an active receive coil element $I_1, \ldots, I_n$. As a result, no unused measurement times $T_{unused}$ develop, but additional data is sampled during the previously unused time slots. This provides a quicker measurement and/or recording of a larger data quantity. A larger data quantity may be used for instance to average the received magnetic resonance signals by the evaluation unit 20 in order to reduce any noise.

The permanent interconnection may naturally be interrupted by any technically required switching times between the interconnection time frames. The permanent interconnection may therefore also be referred as quasi-permanent interconnection, in order to take into account this restriction that is obvious to the person skilled in the art.

A further switching process is shown over time t in FIGS. 5 and 6, in accordance with the example shown in FIG. 1. According to FIG. 1, the whole-body coil includes two active receive coil elements $E_1$, $E_2$, the signals of that are guided through a processing chain by way of the signal inputs $I_1$, $I_2$.

The conventional mode of operation 100 according to the prior art in FIG. 5 provides that all signal inputs $I_1$ to $I_4$ are interconnected consecutively, even if only two active receive coil elements $E_1$, $E_2$ are connected. No active receive coil element is therefore interconnected in a time frame between $t_2$ and $t_3$, for instance.

As shown in FIG. 6, in accordance with the mode of operation 101, the multiplexer 19 repeatedly interconnects the signal inputs $I_1$, $I_2$, that are connected in each case to one of the active receive coil elements $E_1$, $E_2$, i.e. the time frames for $I_1$ and $I_2$ repeat continuously along the time t. Therefore in the time frame between $t_2$ and $t_3$, that remains unused in the prior art according to FIG. 5, the signal input $I_1$ and thus the active receive coil element $E_1$ is interconnected, for instance.

It is additionally shown that the multiplexer 19 interconnects the signal inputs $I_1$, $I_2$ consecutively, that are connected in each case with one of the active receive coil elements $E_1$, $E_2$, i.e. first $I_1$ and subsequently $I_2$ etc. In this regard the sequence remains the same in each cycle, in other words always first $I_1$ and then $I_2$. Furthermore, the time frames during which the multiplexer 19 interconnects the signal inputs are also of the same length.

The number n of active receive coil elements $E_1, \ldots, E_n$ preferably amounts at most to eight. In the example, the number n of active receive coil elements $E_1, \ldots, E_n$ amounts to two active receive coil elements that are included here in the whole-body coil of the magnetic resonance device 10. If an image acquisition only takes place with the whole-body coil, that includes just a few receive channels, so that the number m of signal inputs $I_1, \ldots, I_m$ of the multiplexer 19 clearly exceeds the number n of active receive coil elements $E_1, \ldots, E_n$, the proposed method may be used advantageously.

The number m of signal inputs $I_1, \ldots, I_m$ may amount to at least four. According to the ratio m/n of the number m of signal inputs to the number n of active receive coil elements, in the example shown in FIGS. 1 and 4, twice as much data may be recorded, compared with the conventional mode of operation 101. It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance device for receiving magnetic resonance signals, the magnetic resonance device comprising:
   at least one active receive coil element configured to receive magnetic resonance signals; and
   a multiplexer comprising a signal output and a plurality of signal inputs,
   wherein a first group of signal inputs of the plurality of signal inputs is connected to an active receive coil element of the at least one active receive coil elements in each case,
   wherein a second group of signal inputs of the plurality of signal inputs comprising the remaining signal inputs that are not part of the first group of signal inputs is not connected to an active receive coil element of the at least one active receive coil element, and
   wherein the multiplexer does not interconnect at least part of the second group of signal inputs with the signal output.

2. The magnetic resonance device of claim 1, wherein the multiplexer is configured to permanently interconnect signal inputs of the first group of signal inputs with the signal output.

3. The magnetic resonance device of claim 1, wherein the multiplexer is configured to repeatedly interconnect signal inputs of the first group of signal inputs with the signal output.

4. The magnetic resonance device of claim 1, wherein the multiplexer is configured to consecutively interconnect signal inputs of the first group of signal inputs with the signal output.

5. The magnetic resonance device of claim 4, wherein the multiplexer is configured to interconnect signal inputs of the first group of signal inputs in an identical sequence with the signal output.

6. The magnetic resonance device of claim 1, wherein the multiplexer is configured to interconnect signal inputs of the first group of signal inputs with the signal output during time frames of equal length.

7. The magnetic resonance device of claim 1, wherein the signal output is connected to an analog-digital converter.

8. The magnetic resonance device of claim 1, wherein the at least one active receive coil element comprises eight or less active receive coil elements.

9. The magnetic resonance device of claim 1, wherein the at least one active receive coil element is included in a whole-body coil of the magnetic resonance device.

10. The magnetic resonance device of claim 1, wherein the plurality of signal inputs comprises at least four signal inputs.

11. The magnetic resonance device of claim 1, further comprising an evaluation unit configured to evaluate the magnetic resonance signals received by the at least one active receive coil element.

12. The magnetic resonance device of claim 11, wherein the evaluation unit is configured to average the received magnetic resonance signals.

13. A method for receiving magnetic resonance signals, the method comprising:
    receiving, by at least one active receive coil element, magnetic resonance signals; and
    interconnecting, by a multiplexor comprising a signal output and a plurality of signal inputs, a first group of signal inputs of the plurality of signal inputs to an active receive coil element of the at least one active receive coil element,
    wherein a second group of signal inputs of the plurality of signal inputs is not connected to an active receive coil element of the at least one active receive coil element, and
    wherein at least one part of the second group of signal inputs is not interconnected with the signal output.

14. The method of claim 13, wherein interconnecting the first group of signal inputs to the active receive coil element comprises permanently interconnecting, by the multiplexer, signal inputs of the first group of signal inputs with the signal output.

15. A non-transitory computer-readable storage medium that stores instructions executable by one or more processors to receive magnetic resonance signals, the instructions comprising:
    receiving, from at least one active receive coil element, magnetic resonance signals; and
    interconnecting, between a signal output and a plurality of signal inputs, a first group of signals of the plurality of signal inputs to an active receive coil element of the at least one active receive coil element,
    wherein a second group of signal inputs of the plurality of signal inputs is not connected to an active receive coil element of the at least one active receive coil element, and
    wherein at least one part of the second group of signal inputs is not interconnected with the signal output.

16. The non-transitory computer-readable storage medium of claim 15, wherein the instructions further comprise permanently interconnecting, by the processor, signal inputs of the first group of signal inputs with the signal output.

17. The non-transitory computer-readable storage medium of claim 15, wherein the instructions further comprise repeatedly interconnecting, by the processor, signal inputs of the first group of signal inputs with the signal output.

18. The non-transitory computer-readable storage medium of claim 15, wherein the instructions further comprise consecutively interconnecting, by the processor, signal inputs of the first group of signal inputs with the signal output.

19. The non-transitory computer-readable storage medium of claim 18, wherein the instructions further comprise interconnecting, by the processor, signal inputs of the first group of signal inputs in an identical sequence with the signal output.

20. The non-transitory computer-readable storage medium of claim 15, wherein the instructions further comprise interconnecting, by the processor, signal inputs of the first group of signal inputs with the signal output during time frames of equal length.

* * * * *